(12) United States Patent  
Sohn (10) Patent No.: US 9,054,523 B2
(45) Date of Patent: Jun. 9, 2015

(54) CURRENT DETECTING MECHANISM CAPABLE OF DETECTING GROUND FAULT FOR DIRECT CURRENT CIRCUIT BREAKER

(71) Applicant: LSIS Co., Ltd., Anyang-si, Gyeonggi-do (KR)

(72) Inventor: Jong Mahn Sohn, Cheongju-si (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 167 days.

(21) Appl. No.: 13/889,280

(22) Filed: May 7, 2013

(65) Prior Publication Data

US 2013/0314827 A1   Nov. 28, 2013

(30) Foreign Application Priority Data

May 25, 2012 (KR) .................. 10-2012-0056275
May 25, 2012 (KR) .................. 10-2012-0056277

(51) Int. Cl.
| | |
|---|---|
| *H01H 73/00* | (2006.01) |
| *H02H 3/087* | (2006.01) |
| *H01H 71/12* | (2006.01) |
| *H01C 13/02* | (2006.01) |
| *H01C 7/00* | (2006.01) |
| *H01L 31/08* | (2006.01) |
| *G01R 1/20* | (2006.01) |

(52) U.S. Cl.
CPC ............. *H02H 3/087* (2013.01); *H01H 71/125* (2013.01); *G01R 1/203* (2013.01); *H01C 13/02* (2013.01)

(58) Field of Classification Search
CPC ......................................... H05F 3/06

USPC .......................................................... 361/115
See application file for complete search history.

(56) References Cited

U.S. PATENT DOCUMENTS

| 4,743,875 | A | 5/1988 | Murphy | |
|---|---|---|---|---|
| 6,844,806 | B1 | 1/2005 | Lehmann | |
| 2012/0223807 | A1* | 9/2012 | Sakai et al. | 338/327 |
| 2014/0049358 | A1* | 2/2014 | Kim et al. | 338/309 |
| 2014/0091759 | A1* | 4/2014 | Kagawa et al. | 320/109 |
| 2014/0126158 | A1* | 5/2014 | Baran et al. | 361/729 |
| 2014/0266568 | A1* | 9/2014 | Cheng et al. | 338/314 |

FOREIGN PATENT DOCUMENTS

| DE | 3724116 | 2/1988 |
|---|---|---|
| EP | 0445048 | 9/1991 |

OTHER PUBLICATIONS

European Patent Office Application Serial Number 13167626.4, Search Report dated Nov. 26, 2014, 5 pages.

* cited by examiner

*Primary Examiner* — Dharti Patel
(74) *Attorney, Agent, or Firm* — Lee, Hong, Degerman, Kang & Waimey (57) ABSTRACT

A current detecting mechanism according to this invention includes a direct current shunt having a plurality of resistor members with high resistivity to output an electric potential difference across the resistor members, proportional to a current flowing through an electric load side terminal, as a voltage signal, and a hall sensor assembly having a pair of magnetic cores installed to face each other with an air gap therebetween, and a hall sensor to output an output voltage according to a magnetic flux induced in proportion to a current flowing through a load side terminal, without being connected with the direct current shunt, of load side terminals.

10 Claims, 11 Drawing Sheets

CURRENT DETECTING MECHANISM CAPABLE OF DETECTING GROUND FAULT FOR DIRECT CURRENT CIRCUIT BREAKER

CROSS-REFERENCE TO RELATED APPLICATION

Pursuant to 35 U.S.C. §119(a), this application claims the benefit of earlier filing date and right of priority to Korean Application Nos. 10-2012-0056277 and 10-2012-0056275, filed on May 25, 2012, the contents of which is incorporated by reference herein in its entirety.

BACKGROUND OF THE INVENTION

1. Field of the Invention

This disclosure relates to a direct current circuit breaker, and particularly, to a current detecting mechanism capable of detecting a ground current.

2. Background of the Invention

A high voltage direct current (abbreviated as HVDC) transmission is an electric power transmission method of converting high voltage alternating current (abbreviated as AC hereinafter) electric power (voltage) generated in a generating station into high voltage direct current (abbreviated as DC hereinafter) electric power (voltage) using an electric power converter for transmission and thereafter reconverting the DC voltage into the AC voltage in an electric power-receiving area for supply.

The DC transmission method has an advantage of facilitating device insulation because a maximum value of a DC voltage corresponds to 70% of an AC voltage, and also reducing the quantity of insulators installed in each device and a height of a steel tower for transmission because of a low voltage. Also, when transmitting the same electric power, a power transmission loss in the DC transmission is less than that in the AC transmission. Accordingly, the DC transmission may improve transmission efficiency and reduce the amount of lines used and an area of transmission line. Owing to those advantages, the DC transmission is expected to be increasingly applied later in all parts of the world.

The present disclosure relates to a DC circuit breaker as electrical equipment for DC transmission.

A detection of an amount of electric current (hereinafter, referred to as a detection of electric current) flowing through the DC circuit breaker is the basis for executing a function of the DC circuit breaker of breaking an electrical circuit when a fault current such as a short circuit current, or overcurrent, or ground fault current is generated on the electric circuit. Therefore, it is a very important function in the DC circuit breaker.

In general, an AC circuit breaker facilitates for measuring an AC current using a current transformer or a Rogowski coil sensor. However, the DC circuit breaker is not easy to measure a DC current due to impossibility of measuring a DC current using an induction by an alternating magnetic flux because the DC current is not alternating.

Hereinafter, disclosure will be given of an example of measuring a DC current in a DC circuit breaker according to the related art with reference to FIGS. 1 and 2.

Figure 1:
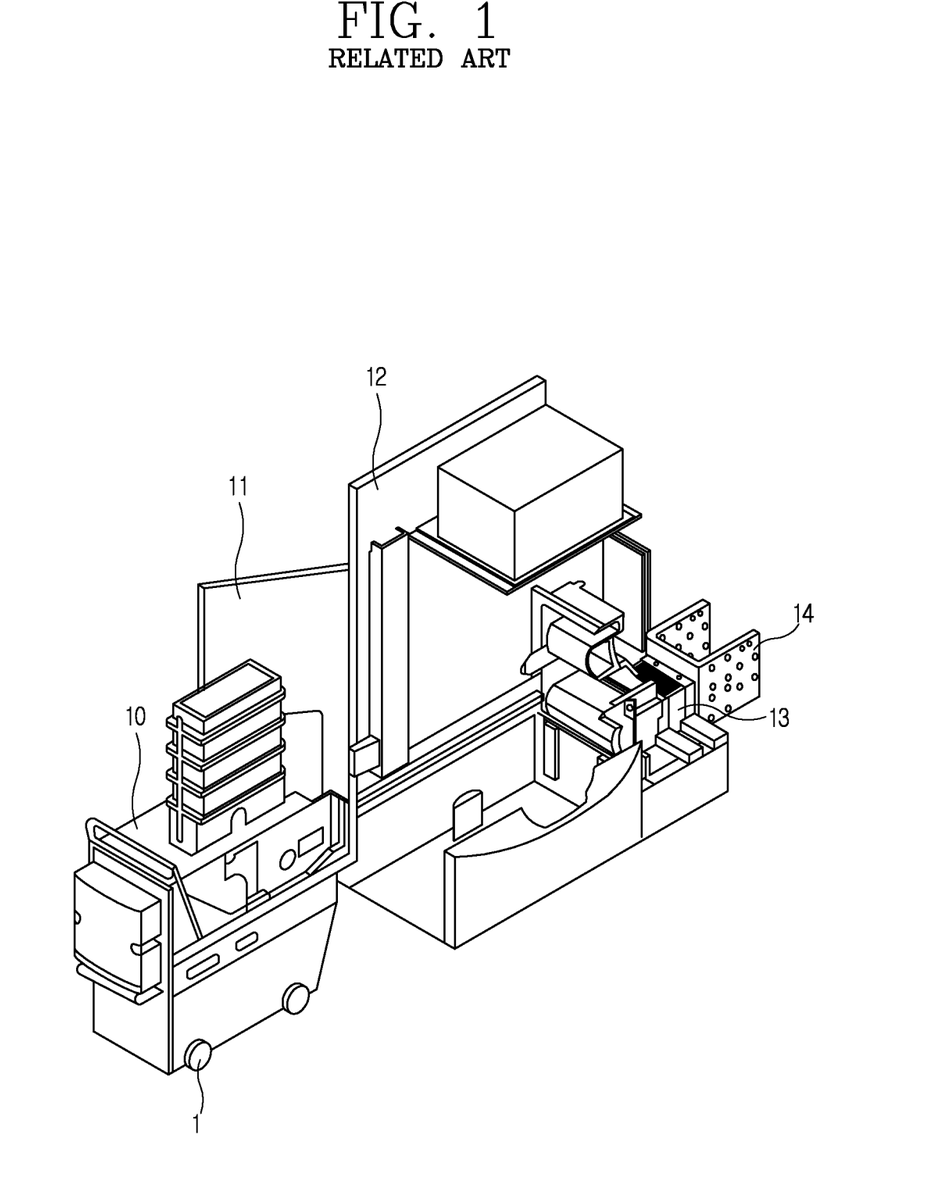
FIG. 1 is a perspective view showing one example of a DC circuit breaker according to the related art.
Figure 2:
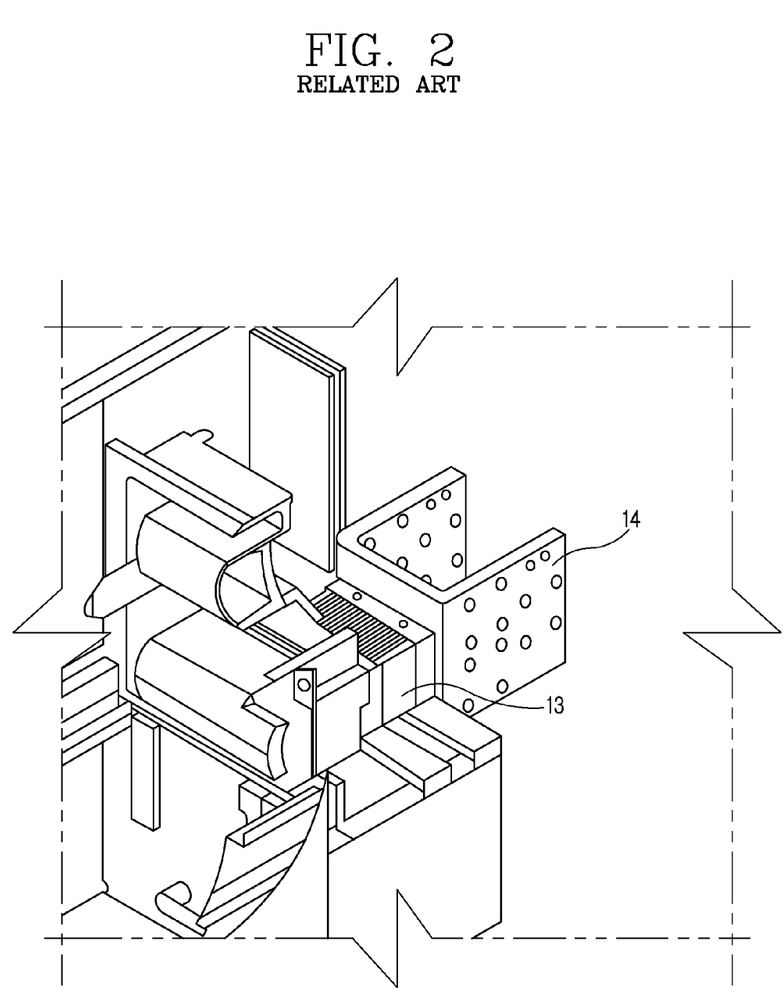
FIG. 2 is a partially enlarged view of a portion of a DC shunt of the DC circuit breaker of FIG. 1.

As shown in FIGS. 1 and 2, a DC circuit breaker according to one example of the related art includes a cradle 12 providing an enclosure, and a breaker main body 10 having a pair of wheels 1 at both lower sides, respectively, and movable to an drawn-in position or a drawn-out position with respect to the cradle 12.

The cradle 12 is a member which provides the enclosure of the DC circuit breaker. The cradle 12 may be provided with a door 11 on its front surface to be opened and closed, and a terminal part 14 configured, for example, as a conductive bus bar to which electric power lines of a electric power source side and an electric load side are connectable.

The DC circuit breaker according to the one example of the related art includes a DC shunt 13 located at the rear of the cradle 12 and electrically connected to the terminal part 14 for detecting a DC current on a DC electric circuit.

When a DC current flows on the terminal part 14 via the electric line connected to the terminal part 14 of the rear of the cradle 12, the corresponding DC current also flows on the DC shunt 13 connected to the terminal part 14 and a voltage in proportion to the flowing DC current is generated across the DC shunt 13. As the corresponding voltage is measured, the DC current may be measured.

Although not shown, a controller (a measuring and control unit), such as an overcurrent relay, is installed at the door 11. The controller, such as the overcurrent relay, determines an occurrence of a fault current such as overcurrent or shortcircuit current based on the DC current on the electric circuit detected by the DC shunt 13, and control the breaker main body 10 to break the circuit.

However, the DC current detecting mechanism for the DC circuit breaker according to the one example of the related art is configured such that the DC shunt 13 is separately fabricated and connected to the terminal part 14 of the rear of the cradle 12. This increases the size of the DC circuit breaker, which makes it difficult to realize size reduction of the DC circuit breaker. Also, as the DC shunt 13 is additionally installed, costs and assembling time are required and an increase in fabricating costs and lowered productivity of the DC circuit breaker are caused.

Hereinafter, disclosure will be given of another example of detecting a current flowing through a DC circuit breaker with reference to FIG. 3.

Figure 3:
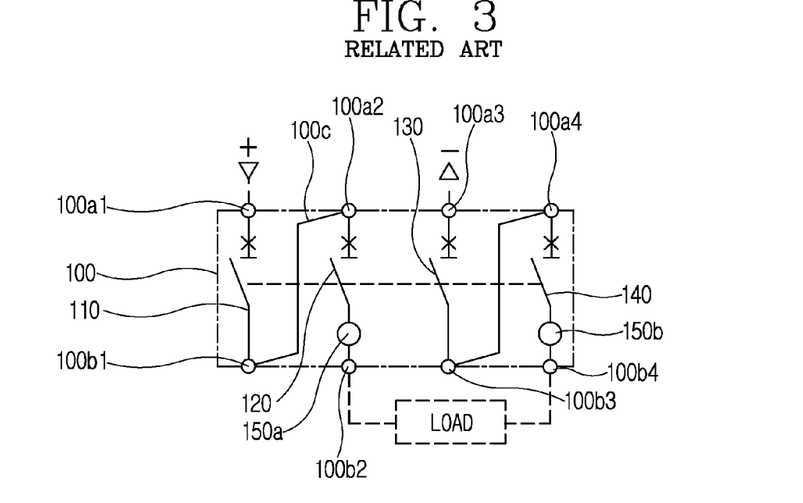
FIG. 3 is a circuitry view of the DC circuit breaker and a current detecting mechanism according to the related art.

In FIG. 3, a reference numeral 100 designates a breaker main body as a main component of the DC circuit breaker.

The DC circuit breaker may include a plurality of main switch units depending on a magnitude of a rated voltage. FIG. 3 exemplarily shows that four main switch units 110, 120, 130, 140 are connected in series to one another. For example, in a DC circuit breaker that a rated voltage is 1000 volts (V), the main switch units 110, 120, 130, 140 are assigned with 250V, respectively.

A DC circuit breaker may also be configured according to another example in which only two of four main switch units 110, 120, 130, 140 are connected to be assigned with 250 V of a rated voltage of 500 V, respectively.

Each of the main switch units 110, 120, 130, 140 may include a movable contact arm 103, a fixed contact arm (not shown), and an arc extinguishing mechanism (not shown) for arc extinguishing.

Referring to FIG. 3, the main switch units 110, 120, 130, 140 may be connected in series by a pair for each of anode and cathode, namely, a pair of main switch units 110, 120 and another pair of main switch units 130, 140 are connected to each other in series.

The breaker main body 100 may further include a switching mechanism (not shown) for simultaneously switching on or off the main switch units 110, 120, 130, 140.

The main switch units 110, 120, 130, 140 may include electric power source side terminals $100a1$, $100a3$, electric power source side common terminals $100a2$, $100a4$, electric load side terminals $100b2$, $100b4$, and electric load side common terminals $100b1$, $100b3$. Here, the electric power source side common terminals 100a2, 100a4 and the electric load side common terminals 100b1, 100b3 may be used as terminals for electrically connecting the electric power source side terminals to the electric load side terminals without an electrical connection to an external line of an electric power source side or an electric load side.

The pair of main switch units 110, 120 and the pair of main switch units 130, 140, each of which is in the connected state in series, may be electrically connected to each other by a connection conductor 100c, respectively.

Anode and cathode of a DC electric power source side may be connected to the electric power source side terminal 100a1 and the electric power source side terminal 100a3, and anode and cathode of a DC load side may be connected to the load side terminal 100b2 and the load side terminal 100b4.

In the meantime, as a member for detecting a current flowing through the DC circuit breaker according to the related art, a first DC shunt 150a and a second DC shunt 150b may be installed on conducting paths via the load side terminal 100b2 and the load side terminal 100b4, respectively. The first and second DC shunts 150a and 150b may output voltage signals, each of which is in proportion to an amount of current flowing along the conducting paths via the load side terminal 100b2 and the load side terminal 100b4, as output signals.

Here, one of the first and second DC shunts 150a and 150b may merely be installed to detect the amount of electric current flowing through the DC circuit breaker. However, in order to detect a ground fault and/or a ground fault current, two DC shunts such as the first and second DC shunts 150a and 150b have to be installed on the conducting paths of the anode and cathode, respectively.

Although not shown, one end of a signal line may be connected to the first and second DC shunts 150a and 150b and the other end of the signal line may be connected to the measuring and control unit such as the overcurrent relay (not shown).

Hereinafter, disclosure will be given of an operation of detecting a current, an operation of determining whether or not a ground fault has occurred and/or detecting a ground current with reference to FIG. 3.

As shown in FIG. 3, anode and cathode of a DC electric power source may be connected to the electric power source side terminal 100a1 and the electric power source side terminal 100a3, respectively.

A DC current may flow from the anode electric power source side 100a1 toward an electric load through the main switch unit 120 and the anode load side terminal 100b2 via the main switch unit 110 in the closed state and the connection conductor 100c. The DC current may then flow from the electric load side into the cathode load side terminal 100b4, and then flow into the main switch unit 130 and the cathode electric power source side terminal 100a1 via the main switch unit 140 in the closed state and the connection conductor 100c.

Here, each of the first and second DC shunts 150a and 150b may output a voltage signal which is proportional to the DC current flowing toward the load side or the DC current flowing from the load side.

The output voltage signal may then be transmitted to a microprocessor of the measuring and control unit such as the overcurrent relay which is connected via the signal line. The corresponding microprocessor may convert the received voltage signal into a current according to a predetermined ratio of current to voltage and a conversion program, and measure an amount of current flowing through the DC circuit breaker.

An operation of detecting whether or not a ground fault has occurred will be described as follows.

When a ground fault has not occurred on a circuit connected to the DC circuit breaker, the first DC shunt 150a installed on the conducting path connected to the anode load side terminal 100b2 in series and the second DC shunt 150b installed on the conducting path connected to the cathode load side terminal 100b4 in series may output voltage signals which have the same value with different signs to transmit to the microprocessor of the measuring and control unit. The microprocessor may then add the output voltages (i.e., obtain a sum of vectors) to obtain a result of 0 (zero). Here, the microprocessor may decide non occurrence of the ground fault.

When the ground fault has occurred on the circuit connected to the DC circuit breaker, the first DC shunt 15 installed on the conducting path connected to the anode load side terminal 100b2 in series may output an output voltage corresponding to the current. However, since the fault current (ground current) is introduced into the cathode DC electric power source side via the ground of a frame of the DC circuit breaker, an output voltage of the second DC shunt 150b may be a value whose absolute value is different from the output voltage of the first DC shunt 150a.

Hence, the microprocessor of the measuring and control unit such as the overcurrent relay connected to the first and second DC shunts 150a and 150b may add the output voltages output from the first and second DC shunts 150a and 150b to obtain a value which is proportional to the ground current, other than 0 (zero). Accordingly, the microprocessor may measure the amount of ground current and decide the occurrence of the ground fault.

However, in the related art, the output voltage signals of the first DC shunt 120a and the second DC shunt 120b are very high voltages of an electric power system. Accordingly, those output voltage signals may not be applied to the measuring and control unit as they are, but should be applied via an insulation and step-down transformer. Therefore, the insulation and step-down transformer has to be equipped.

Especially, to deal with a voltage of a DC electric system reaching up to 1000 Volt, the insulation and step-down transformer has to be designed to tolerate a voltage more than 1000 Volt. This may result in an increase in size of the DC circuit breaker and fabricating costs thereof.

SUMMARY OF THE INVENTION

Therefore, to overcome the drawbacks of the related art, an aspect of the this disclosure is to provide a direct current (DC) detecting mechanism for a DC circuit breaker, capable of reducing a size of the DC circuit breaker and minimizing costs and time, which are required due to an installation of an additional component and a structural change, by utilizing the existing configuration of the DC circuit breaker.

Another aspect of the this disclosure is to provide a DC detecting mechanism for a DC circuit breaker, capable of detecting a current, determining an occurrence of a ground fault, measuring a ground fault current, and requiring no insulation and step-down transformer.

To achieve these and other advantages and in accordance with the purpose of this disclosure, as embodied and broadly described herein, there is provided a direct current detecting mechanism for a direct current circuit breaker, the circuit breaker having an electric power source side terminal and an electric load side terminal, the mechanism comprising:
 a direct current detecting shunt,
  wherein the direct current detecting shunt comprises:
  a plurality of resistor members with high resistivity;

a connection conductor having a plurality of first recess portions in which the resistor members are inserted; and a load terminal part having a plurality of second recess portions in which the resistor members are inserted.

In accordance with another aspect of the present disclosure, there is provided a current detecting mechanism for a direct current circuit breaker, the circuit breaker having at least a pair of electric power source side terminals and at least a pair of electric load side terminals, the mechanism comprising:

a direct current shunt installed to be electrically connected to one of the pair of electric load side terminals and having a plurality of resistor members with high resistivity, the direct current shunt outputting an electric potential difference across the resistor members, which is proportional to a current flowing through the connected load side terminal, as a voltage signal; and a hall sensor assembly having a pair of magnetic cores installed near the other of the pair of electric load side terminals with being spaced therefrom for insulation, the pair of magnetic cores being installed to face each other with an air gap therebetween, and a hall sensor installed in the air gap between the magnetic cores, the hall sensor outputting an output voltage according to a magnetic flux induced in proportion to a current flowing through the other of the pair of load side terminals.

According to another aspect of the present disclosure, the plurality of resistor members may be configured as a plurality of plate-shaped resistor members with the high resistivity, and each first recess portion of the connection conductor and each second recess portion of the load terminal part may be configured by a linear recess portion.

According to still another aspect of the present disclosure, the plurality of resistor members may be configured by a plurality of rod-shaped resistor members with the high resistivity, and each first recess portion of the connection conductor and each second recess portion of the load terminal part may be configured by a circular recess portion.

According to still another aspect of the present disclosure, the connection conductor may be connected with a movable contact arm of the direct current circuit breaker.

According to still another aspect of the present disclosure, resistance of the resistor member may have a ratio of 10% to 15% of contact resistance between the connection conductor and the load terminal part when the maximum rated current flows.

According to still another aspect of the present disclosure, the resistor members may be electrically connected to the connection conductor and the load terminal part in a brazing manner after being inserted into the first recess portions of the connection conductor and the second recess portions of the load terminal part.

According to still another aspect of the present disclosure, the direct current shunt may include a plurality of resistor members with high resistivity, a connection conductor having a plurality of first recess portions in which the resistor members are inserted, and an electric load terminal part having a plurality of second recess portions in which the resistor members are inserted.

According to still another aspect of the present disclosure, the direct current shunt may be installed on an anode load side terminal of the pair of load side terminals in a contact manner, and the hall sensor may be installed near a cathode load side terminal of the pair of load side terminals in a non-contact manner.

According to still another aspect of the present disclosure, the plurality of resistor members may be configured as a plurality of plate-shaped resistor pieces or a plurality of resistor rods with high resistivity.

Further scope of applicability of the present application will become more apparent from the this disclosure given hereinafter. However, it should be understood that the this disclosure and specific examples, while indicating preferred embodiments of the invention, are given by way of illustration only, since various changes and modifications within the spirit and scope of the invention will become apparent to those skilled in the art from the this disclosure.

BRIEF DESCRIPTION OF THE DRAWINGS

The accompanying drawings, which are included to provide a further understanding of the invention and are incorporated in and constitute a part of this disclosure, illustrate exemplary embodiments and together with the disclosure serve to explain the principles of the invention.

In the drawings.

DETAILED DESCRIPTION OF THE INVENTION

Disclosure will now be given in detail of the exemplary embodiments, with reference to the accompanying FIGS. 4 to 13. For the sake of brief description with reference to the drawings, the same or equivalent components will be provided with the same reference numbers, and disclosure thereof will not be repeated.

Hereinafter, disclosure will be given of mechanical and electrical connection structures of a current detecting mechanism in a DC circuit breaker according to the present disclosure, with reference to FIGS. 4 and 5.

Figure 4:
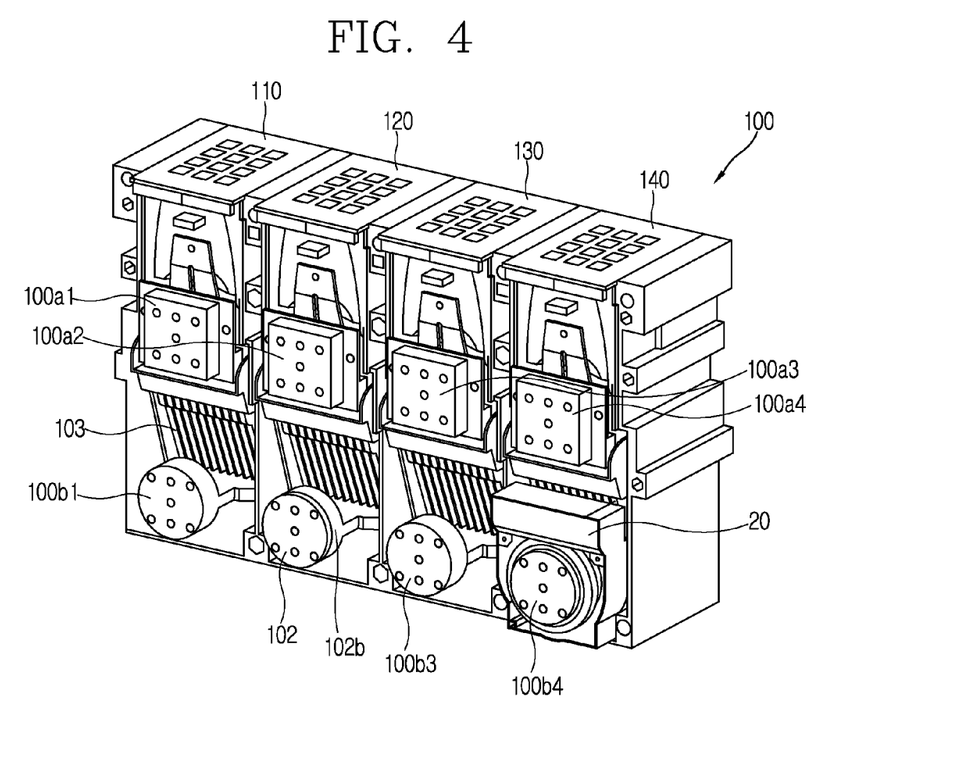
FIG. 4 is a rear perspective view showing a breaker main body of a DC circuit breaker in accordance with one exemplary embodiment of the present disclosure.

As shown in FIG. 4, a DC circuit breaker having a current detecting mechanism according to one exemplary embodiment may include a breaker main body 100, and a cradle (not shown) providing an enclosure of the DC circuit breaker.

The breaker main body 100 according to the one exemplary embodiment may include four main switch units 110, 120, 130, 140, and a switching mechanism (not shown) to provide a driving force for switching (closing or opening) each of the main switch units. Here, the switching mechanism may include a switching spring to apply a driving force, and a plurality of links and latches for transferring the driving force. Each of the main switch units 110, 120, 130, 140 may include a movable contact arm 103 and a corresponding fixed contact arm (not shown). The four main switch units 110, 120, 130, 140 may be simultaneously switched by a main shaft (not shown) which is commonly connected to the four main switch units 110, 120, 130, 140.

The breaker main body 100 may include a plurality of main switch units according to a magnitude of a rated voltage of the DC circuit breaker. The exemplary embodiment shown in FIGS. 4 and 5 illustrates that four main switch units 110, 120, 130, 140 are connected in series for each of anode and cathode. For example, in a DC circuit breaker that a rated voltage is 1000 volts (V), the main circuits 110, 120, 130, 140 are assigned with 250V, respectively. A DC circuit breaker may also be configured according to another exemplary embodiment, different from the embodiment shown in FIGS. 4 and 5, in which only two of four main switch units 110, 120, 130, 140 are connected to be assigned with 250 V of a rate voltage of 500 V, respectively.

Each of the main switch units 110, 120, 130, 140 may include a movable contact arm 103, a fixed contact arm (not shown), and an arc extinguishing mechanism (not shown) for arc extinguishing. Also, in the circuitry structure shown in FIG. 5, the electrical structure of the main switch units 110, 120, 130, 140 may be the same as a circuit that four switches are connected in series by a pair for each pole of positive and negative(in other words anode and cathode).

Referring to FIG. 4, the main switch units 110, 120, 130, 140 may include electric power source side terminals 100a1, 100a3 and electric power source side common terminals 100a2, 100a4 horizontally arranged on a middle portion in a perpendicular direction, and an electric load side terminal 100b4, a DC shunt 102 and electric load side common terminals 100b1, 100b3 horizontally arranged on a lower portion. Here, the electric power source side common terminals 100a2, 100a4 and the electric load side common terminals 100b1, 100b3 may be used as terminals which electrically connect the electric power source side terminals and the electric load side terminals to each other without an electrical connection to an external line of the electric power source side or the electric load side.

Figure 5:
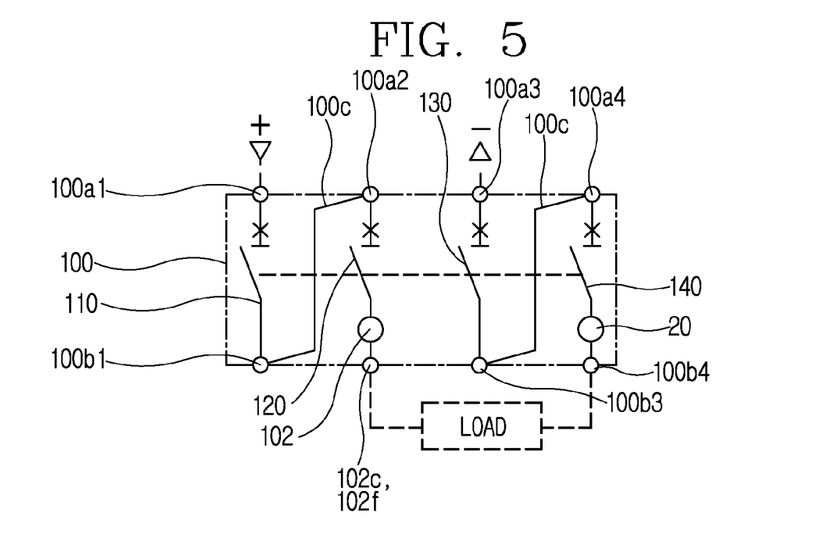
FIG. 5 is a circuitry view showing a current detecting mechanism for the DC circuit breaker in accordance with the one exemplary embodiment of the present disclosure.
Figure 6:
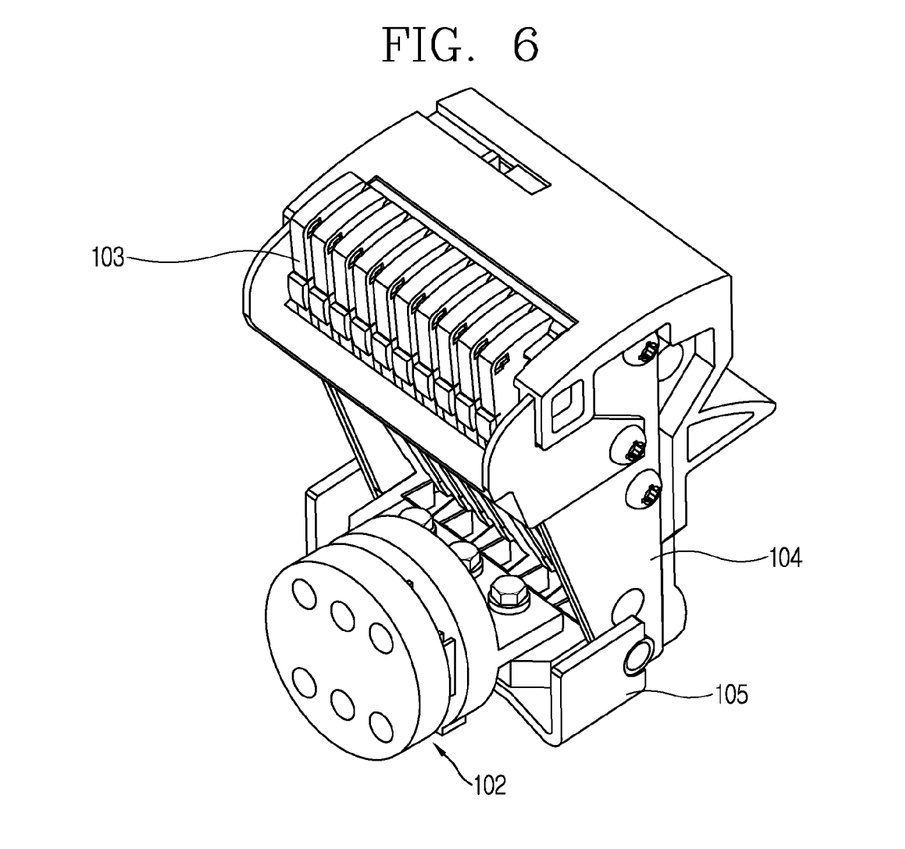
FIG. 6 is an assembled perspective view of a DC shunt and a movable contact assembly of the current detecting mechanism for the DC circuit breaker in accordance with the one exemplary embodiment of the present disclosure.

Referring to FIG. 5, the pair of main switch units 110 and 120 and the pair of main switch units 130 and 140 each in a serially connected state may be electrically connected to each other via a connection conductor 100c, respectively.

The electric power source side terminal 100a1 and the electric power source side terminal 100a3 may be connected with anode and cathode of a DC electric power source side, respectively. Also, the DC shunt 102 and the electric load side terminal 100b4 may be connected with anode and cathode of a DC load side, respectively.

Referring to FIGS. 4 and 5, for current detection and detection of an occurrence of a ground fault and ground fault current, the DC detecting mechanism for the DC circuit breaker may include a DC shunt 102 and a hall sensor assembly 20 according to the preferred embodiment.

In accordance with the preferred embodiment, the DC shunt 102 may be electrically connected to one of a pair of load side terminals, namely, an electric load terminal part 102c, 102f, which is connected to the main switch unit 120 in FIG. 5. The DC shunt 102 may be contactable with the electric load terminal part 102c, 102f.

Especially, according to the preferred embodiment, the DC shunt 102 may form one electric load terminal including the load terminal part 102c, 102f.

Hereinafter, a detailed configuration of the DC shunt 102 will be described with reference to FIGS. 7 to 9 and FIGS. 12 and 13.

Figure 7:
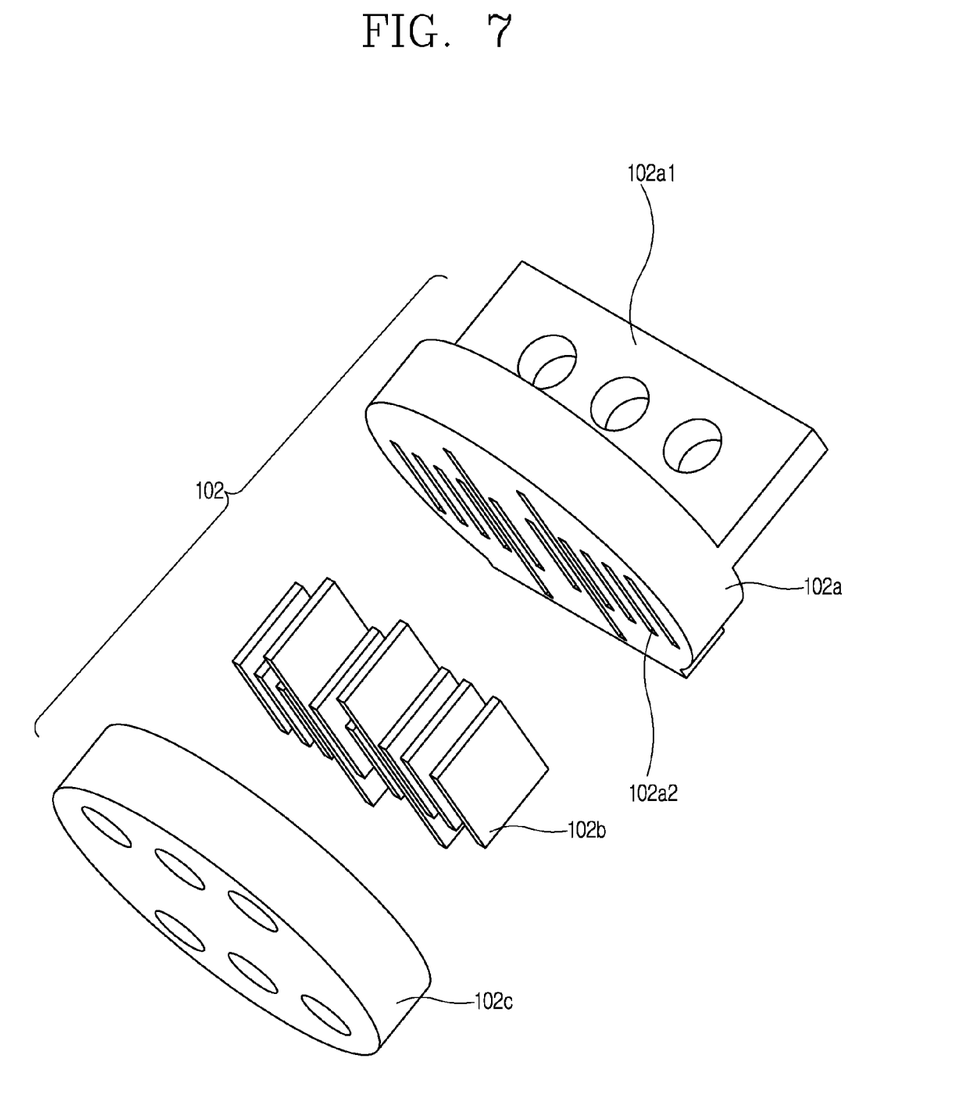
FIG. 7 is an exploded perspective view showing a DC shunt of the current detecting mechanism for the DC circuit breaker in accordance with one exemplary embodiment of the present disclosure.
Figure 8:
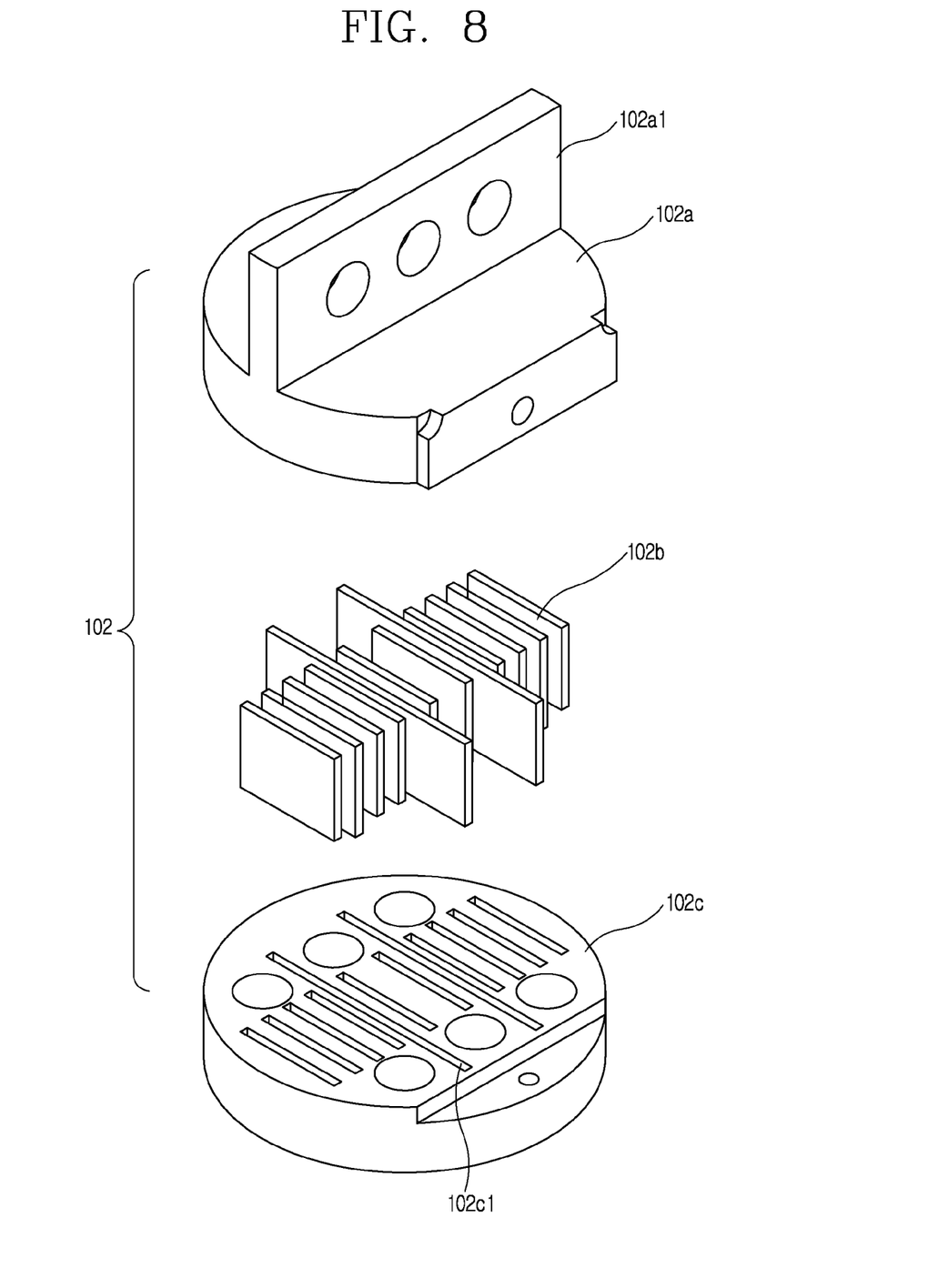
FIG. 8 is an exploded perspective view showing the DC shunt of the current detecting mechanism for the DC circuit breaker in accordance with the one exemplary embodiment of the present disclosure.
Figure 9:
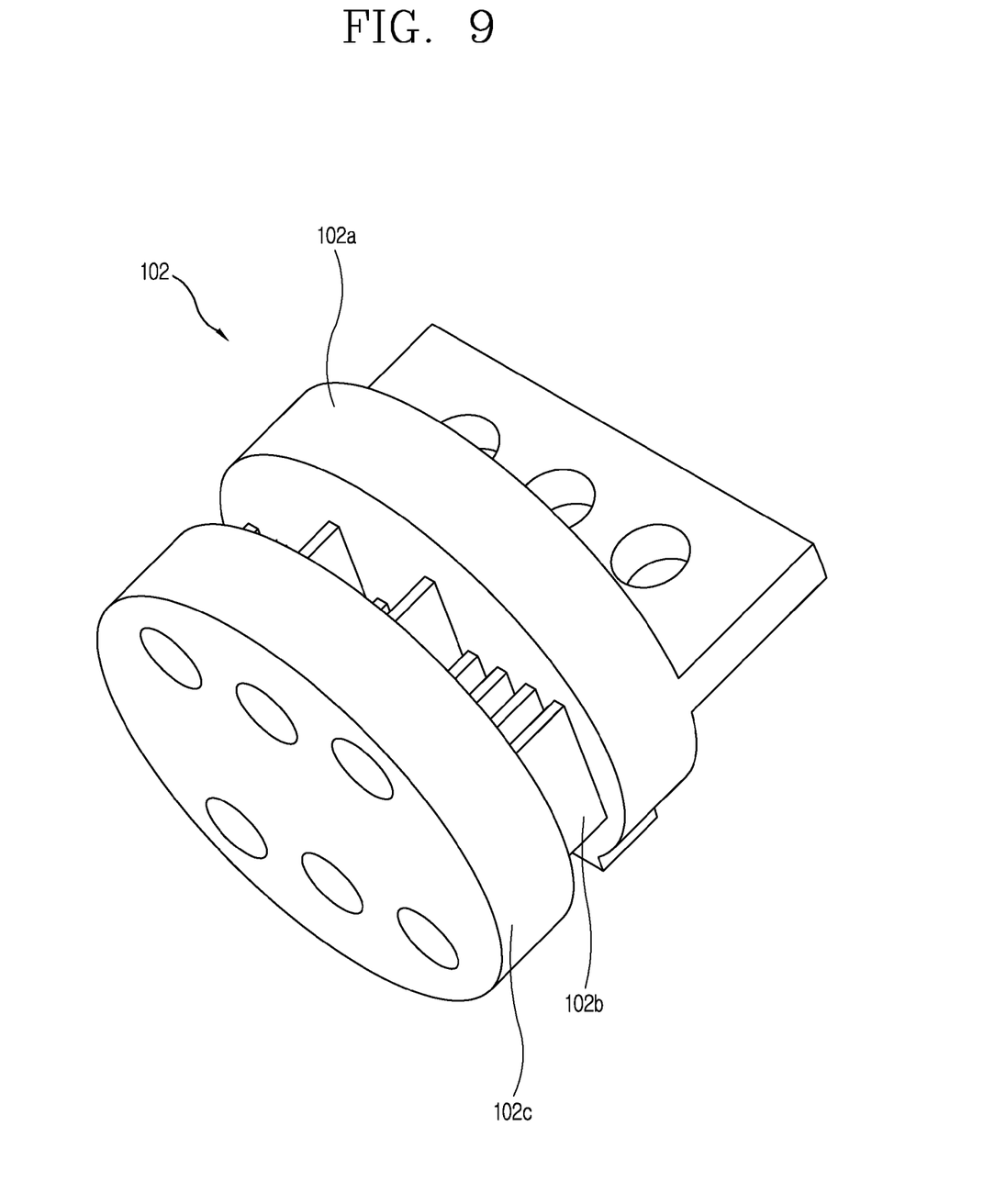
FIG. 9 is an assembled perspective view of the DC shunt of the current detecting mechanism for the DC circuit breaker in accordance with the one exemplary embodiment of the present disclosure.

The DC shunt 102 according to one exemplary embodiment, as shown in FIGS. 7 to 9, may include a plurality of plate-shaped resistor members 102b, a connection conductor 102a and an electric load terminal part 102c.

The plurality of plate-shaped resistor members 102b may be configured as a plurality of resistor pieces in a shape of plate with high resistivity.

According to the one exemplary embodiment, when the maximum rated current flows, resistance of the plate-shaped resistor member 102b may have a ratio of 10% to 15% of a contact resistance between the connection conductor 102a and the electric load terminal part 102c.

The connection conductor 102a may be a member electrically connected to a plurality of movable contact arms 103 via a connection conductor plate with a plurality of flexible wire insertion grooves (not shown) and a plurality of flexible wires (not shown). The connection conductor 102a, referring to FIG. 7, may include a plurality of first recess portions 102a2, formed by linear recess portions (slit portions) in which the plurality of plate-shaped resistor members 102b are inserted.

The electric load terminal part 102c is a portion forming an electric load side terminal of the DC circuit breaker, together with the connection conductor 102a. The load terminal part 102c may be electrically connected to an electric load side line. Referring to FIG. 8, the electric load terminal part 102c may include a plurality of second slit portions 102c1 formed in linear recess portions (slits) in which the plurality of plate-shaped resistor members 102b are inserted.

The plurality of plate-shaped resistor members 102b of the DC shunt 102 may be contactably inserted into the load terminal part 102c and the connection duct 102a, which form the electric load side terminal, so as to be connected with each other electrically.

The plate-shaped resistor members 102b may be electrically connected to the connection duct 102a and the load terminal part 102c in a brazing manner after being inserted into the first recess portions 102a2 of the connection conductor 102a and the second recess portions 102c1 of the load terminal part 102c.

The DC shunt 102 may be directly contactable with the electric load terminal part 102c and the connection conductor 102a forming the anode load side terminal.

Also, the DC shunt 102 may output, as a voltage signal, an electrical potential difference across the resistor member 102b, which is proportional to a current flowing through the electric load terminal part 102c and the connection conductor 102a.

As such, the output voltage of the DC shunt 102 is not a voltage according to a high electrical potential difference between electric load terminals of a DC electric power system connected with the DC circuit breaker but is the low electrical potential difference across the resistor member 102b of the DC shunt 102. Therefore, a high voltage of the electric power system may not be applied to a measuring and control unit such as an overcurrent relay.

Hereinafter, a configuration of a DC shunt in accordance with another exemplary embodiment will be described with reference to FIGS. 12 and 13.

Figure 12:
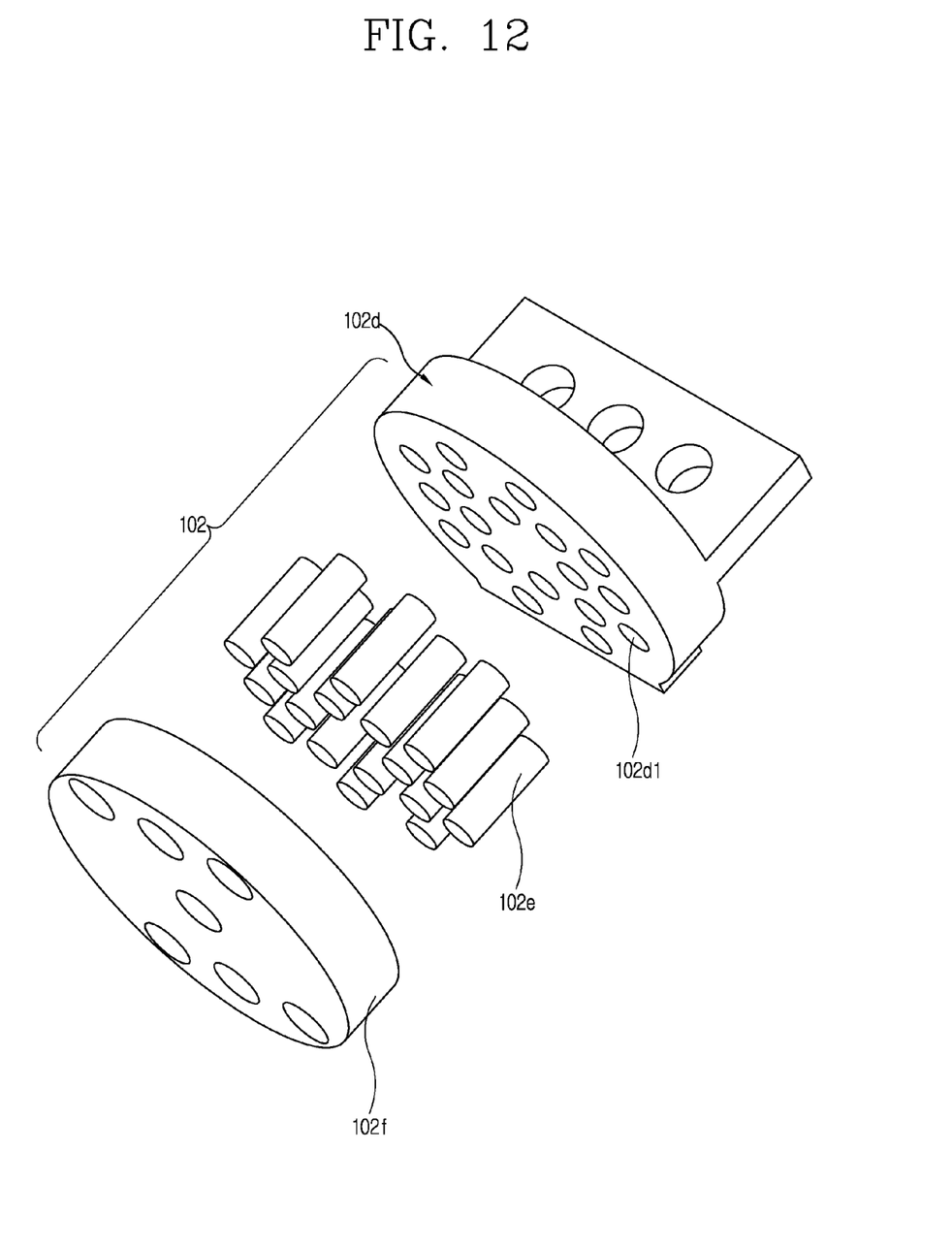
FIG. 12 is an exploded perspective view showing components of a DC shunt in accordance with another exemplary embodiment of the present disclosure.
Figure 13:
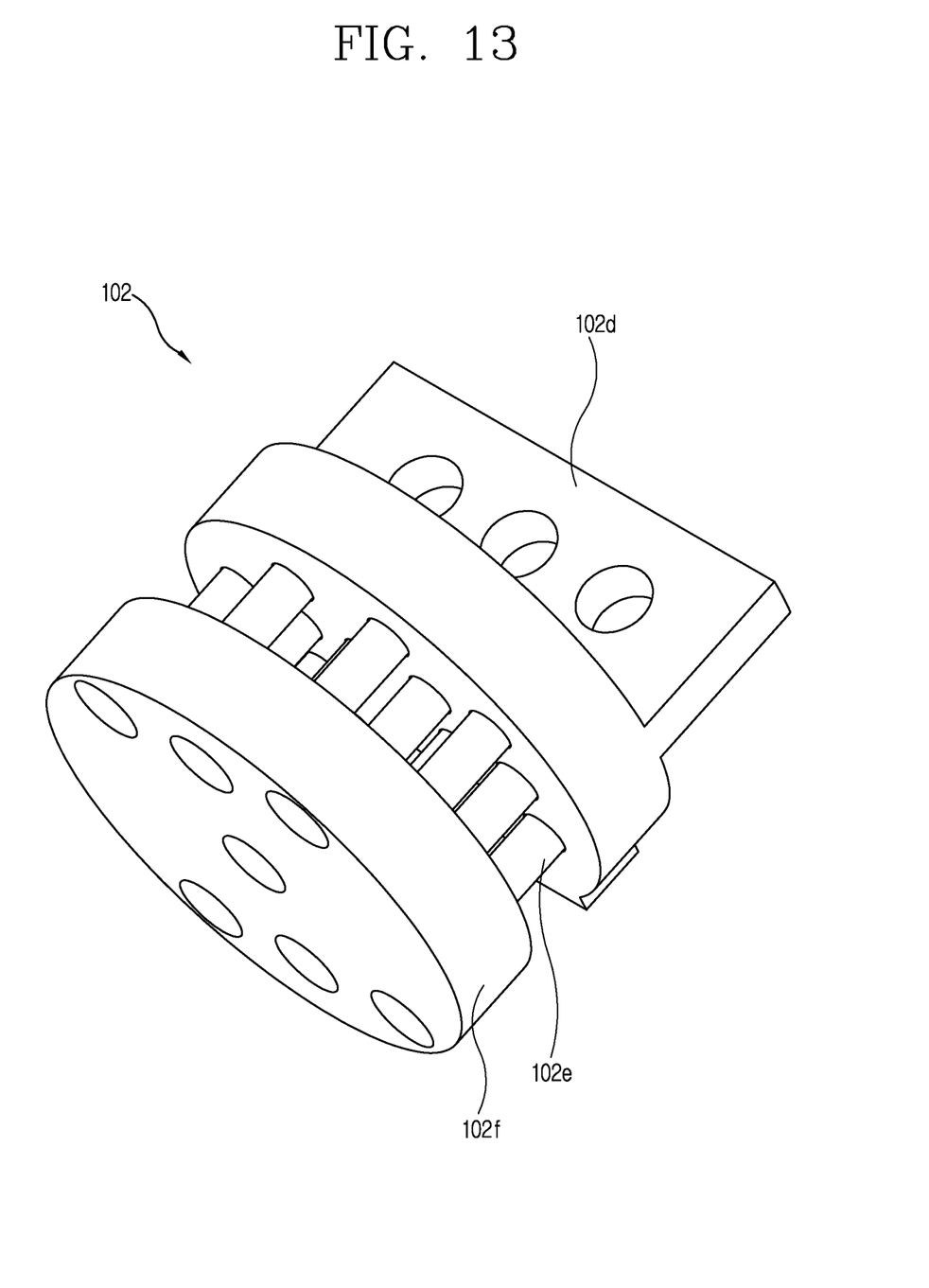
FIG. 13 is an assembled perspective view showing the DC shunt in accordance with the another exemplary embodiment of the present disclosure.

A DC shunt 102 according to another exemplary embodiment, as shown in FIGS. 12 and 13, may include a plurality of rod-shaped resistor members 102e, a connection conductor 102d and an electric load terminal part 102f.

The plurality of rod-shaped resistor members 102e may be configured by a plurality of resistor rods in a shape of rod with high resistivity.

In accordance with the another exemplary embodiment, when the maximum rated current flows, resistance of the rod-shaped resistor member 102e may have a ratio of 10% to 15% of a contact resistance between the connection conductor 102d and the load terminal part 102f.

The connection conductor 102d may be a member electrically connected to a plurality of movable contact arms 103 via a connection conductor plate with a plurality of flexible wire insertion grooves (not shown) and a plurality of flexible wires (not shown). The connection conductor 102d, referring to FIG. 12, may include a plurality of first recess portions 102d1, formed by circular recess portions, in which the plurality of rod-shaped resistor members 102e are inserted.

The load terminal part 102f is a portion forming an electric load side terminal of the DC circuit breaker, together with the connection conductor 102d. The load terminal part 102c may be electrically connected to an electric load side line (wire). Referring to FIG. 8, the load terminal part 102f may include a plurality of second recess portions (not shown), formed by circular recess portions, in which the plurality of rod-shaped resistor members 102e are inserted.

The plurality of rod-shaped resistor members 102e of the DC shunt 102 may be electrically inserted into the load terminal part 102f and the connection duct 102d, which form the load side terminal, so as to be contactable with each other.

The rod-shaped resistor members 102e may be electrically connected to the connection conductor 102d and the load terminal part 102f in a brazing manner after being inserted into the first recess portions 102d1 of the connection conductor 102d and the second recess portions (not shown) of the load terminal part 102f.

The DC shunt 102 may be directly contactable with the load terminal part 102f and the connection conductor 102d forming the anode load side terminal.

Also, the DC shunt 102 may output, as a voltage signal, an electric potential difference across the resistor member 102e, which is proportional to a current flowing through the load terminal part 102f and the connection conductor 102d.

As such, the output voltage of the DC shunt 102 is the electric potential difference across the resistor member 102e of the DC shunt 102, other than a voltage according to an electric potential difference between load terminals of a DC electric power system connected with the DC circuit breaker. Therefore, a high voltage of an electric power system may not be applied to the measuring and control unit such as the overcurrent relay.

In the meantime, the hall sensor assembly 20, referring to FIG. 4, may be installed near the cathode load side terminal 100b4.

Figure 10:
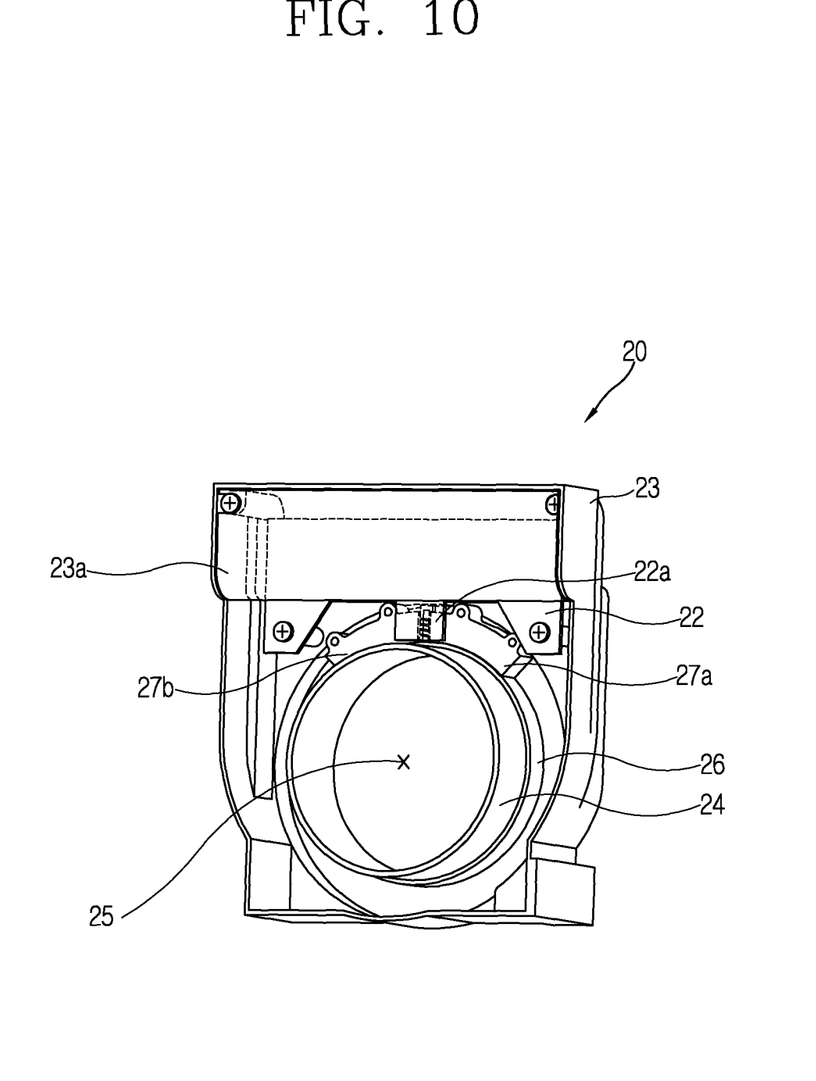
FIG. 10 is an assembled perspective view showing a hall sensor assembly of the current detecting mechanism for the DC circuit breaker in accordance with the one exemplary embodiment of the present disclosure.
Figure 11:
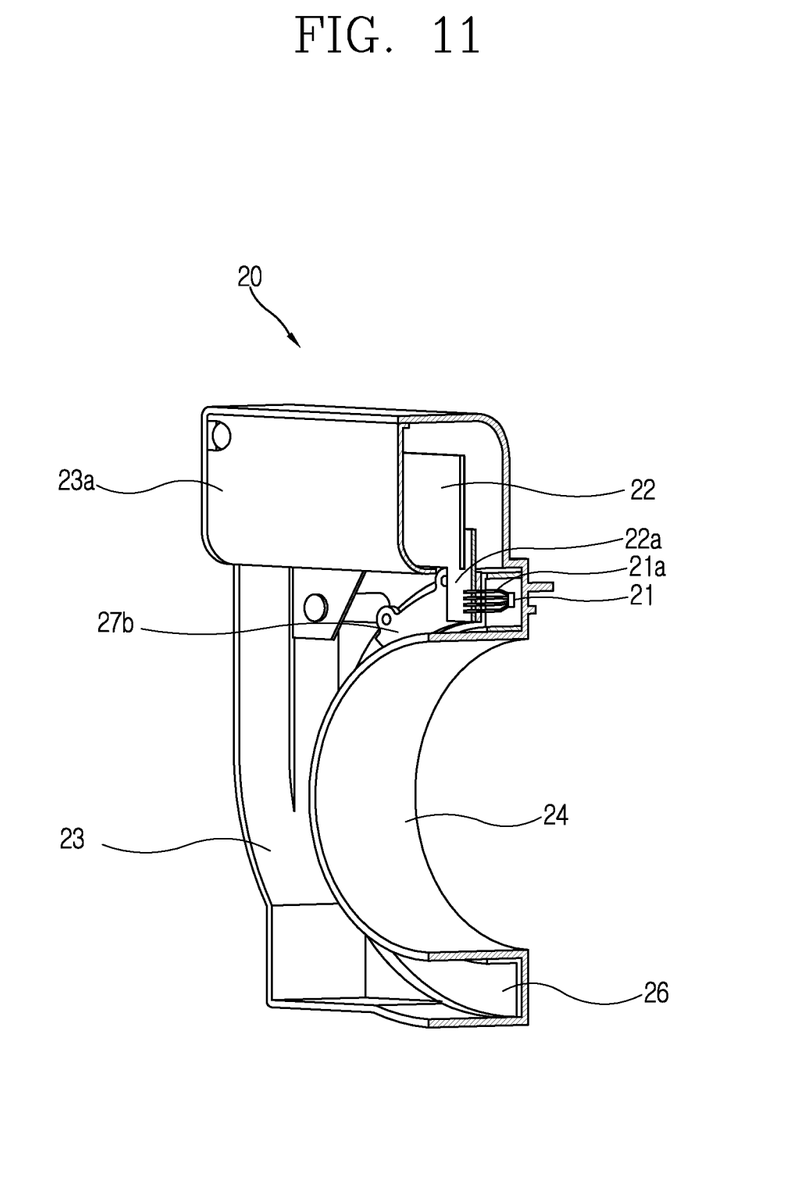
FIG. 11 is a longitudinal sectional view of the hall sensor assembly of FIG. 10.

The hall sensor assembly 20, as shown in FIGS. 10 and 11, may include a pair of magnetic cores 27a and 27b and a hall sensor 21.

The pair of magnetic cores 27a and 27b may be installed near the other of the pair of electric load side terminals, namely, near the load side terminal 100b4, on which the DC shunt 1012 is not disposed, with a spaced gap to be insulated from the load side terminal 100b4. The pair of magnetic cores 27a and 27b may be installed to face each other with an air gap therebetween.

The hall sensor 21 may be installed in the air gap between the magnetic cores 27a and 27b. The hall sensor 21 may output an output voltage according to a magnetic flux, which is induced in proportion to a current flowing through the load side terminal 100b4, on which the DC shunt 102 is not disposed.

Referring to FIGS. 10 and 11, the hall sensor assembly 20 may further include an enclosure 23, a cover 23a, a hall sensor output controller 22, an extended circuit board portion 22a, a terminal insertion tubular portion 24, and a magnetic circuit holder 26.

The enclosure 23 may be a member which is made of an electrically insulating material, such as synthetic resin with an electrical insulation property, and has a shape of a box with an open one side. The enclosure 23 may have the terminal insertion tubular portion 24 formed through a central portion thereof to allow the load side terminal 100b4 (see FIG. 4) to be inserted therethrough. The terminal insertion tubular portion 24 may have a diameter greater than that of the load side terminal 100b4.

The enclosure 23 may be installed by inserting the load side terminal 100b4 through an inner hollow portion 25 of the terminal insertion tubular portion 24.

The cover 23a is a member for protecting a printed circuit board which configures the hall sensor output controller 22. The cover 23a may include a long horizontal plate portion and a bent portion which is bent from the corresponding horizontal plate portion to extend backwardly. The cover 23a may also be made of an electrical insulating material such as synthetic resin. The cover 23a may be coupled to the enclosure 23 by coupling a fixing screw into a screw pole protruding from the enclosure 23.

The hall sensor 21 may be installed at a position within the enclosure 23 near the terminal insertion tubular portion 24, to output a voltage signal which is proportional to an amount of magnetic flux according to an amount of DC current flowing through the load side terminal 100b4. In other words, the magnetic flux may be generated around the DC current flowing through the load side terminal 100b4, and the amount of magnetic flux may be in proportion to the amount of current. The hall sensor 21 may output a voltage signal in proportion to an amount of magnetic flux applied. The hall sensor 21, as well known, may include pin terminals 21a, as output terminals, to be connected to the printed circuit board.

The hall sensor output controller 22 may be configured as the printed circuit board which is fixed to the enclosure 23 by fixing members such as screws.

The hall sensor output controller 22 may be electrically connected to the hall sensor 21 to support the hall sensor 21. The hall sensor output controller 22 may process and output the voltage signal of the hall sensor 21. In other words, since the hall sensor output controller 22 is configured as the printed circuit board, after the pin terminals 21a of the hall sensor 21 are inserted into connection openings of the printed circuit board, the hall sensor 21 and the hall sensor output controller 22 may be electrically connected in a soldering manner. Also, the hall sensor output controller 22 may include an electric power supply circuit portion for supplying power to the hall sensor 21, an amplification circuit portion for amplifying the output signal of the hall sensor 21, a temperature compensation circuit portion and the like. The corresponding circuits may amplify and compensate for the voltage signal from the hall sensor 21. The processed voltage signal may be transmitted to the control unit such as the overcurrent relay of the DC circuit breaker connected thereto using a signal line (not shown) via an output terminal.

The extended circuit board portion 22a may extend from the hall sensor output controller 22 for an electrical connection with the hall sensor 21. The extended circuit board portion 22a may include connection openings into which the pin terminals 21a of the hall sensor 21 are inserted and soldered.

The terminal insertion tubular portion 24, as shown in FIG. 9, may be formed through a lower portion of a center of the enclosure 23. The terminal insertion tubular portion 24 may form a hollow portion 25 for allowing the load side terminal 100b4 to be inserted therethrough.

The magnetic circuit holder 26 may be fixed to surround the terminal insertion tubular portion 24, and support the pair of magnetic cores 27a and 27b. The pair of magnetic cores 27a and 27b may be fixed to the magnetic circuit holder 26 by inserting a plurality of fixing screws through the pair of magnetic cores 27a and 27b and the magnetic circuit holder 26.

Hereinafter, disclosure will be given of operations of detecting a current and detecting a ground fault and a ground current in the current detecting mechanism for the DC circuit breaker according to the preferred embodiment, with reference to the accompanying drawings.

Referring to FIG. 3, anode and cathode of a DC electric power source may be connected to the electric power source side terminals 100a1 and 100a3, respectively.

A DC current may flow from the anode electric power source side terminal 100a1 toward an electric load side through the main switch unit 120, the DC shunt 102 and the load terminal part 102c, 102f of the DC shunt 102 via the main switch unit 110 in a closed state and the connection conductor 100c. The DC current may then flow from the electric load side into the main switch unit 130 and the cathode electric power source side terminal 100a3 through the main switch unit 140 in a closed state and the connection conductor 100c via the cathode lower side terminal 100b4.

Here, the DC shunt 102 and the hall sensor assembly 20 may output a voltage signal in proportion to a DC current which flows toward the electric load side or a DC current which flows from the electric load side. However, the DC shunt 102 may not output a high voltage of a DC electric power system but output only a voltage across the resistor member 102b, 102e. The hall sensor assembly 20 may detect an output voltage corresponding to a current flowing on the load terminal side in a non-contact manner. Therefore, unlike the related art, an insulation and step-down transformer for transferring the detected voltage signal to the control unit such as the overcurrent relay may not be required.

The output voltage signal may then be transmitted to the microprocessor of the measuring and control unit such as the overcurrent relay, which is connected via a signal line. The corresponding microprocessor may convert the received voltage signal according to a ratio of current to voltage which has been predetermined and stored and a conversion program, so as to measure an amount of current flowing through the DC circuit breaker.

Hereinafter, disclosure will be given of an operation of determining whether or not a ground fault has occurred and an operation of detecting a ground fault current in the DC circuit breaker according to the preferred embodiment.

When a ground fault has not occurred in an electric power circuit connected to the DC circuit breaker, the DC shunt 102, which is installed on a conducting path serially connected to the anode load side terminal part 102c, 102f in a contact manner, and the hall sensor assembly 20, which is installed on a connecting path serially connected to the cathode load side terminal 100b4 in a non-contact manner, may output voltage signals (output voltages) which have opposite signs and different levels from each other.

After receiving the voltage signals output from the DC shunt 102 and the hall sensor assembly 20, the microprocessor of the measuring and control unit such as the overcurrent relay may scale the levels of the received voltage signals according to the predetermined ratio.

The scaled output voltages may be added to each other (i.e., acquiring a sum of vectors) so as to obtain a value of 0 (zero). Here, the microprocessor may decide that any ground fault has not occurred.

When the ground fault has occurred in the circuit connected to the DC circuit breaker, the DC shunt 102 which is installed on the conducting path serially connected to the anode load side terminal 102c, 102f may output an output voltage corresponding to a current. Since the fault current (i.e., ground current) is introduced into the cathode DC electric power source side through a ground of the enclosure of the DC circuit breaker, the output voltage of the hall sensor assembly 20 may be a value whose absolute value is different from the output voltage of the DC shunt 102 eve if those output voltages are scaled according to the predetermined ratio.

According to the present disclosure, the DC shunt 102 may not output a high voltage of a DC electric power system, but output a voltage across the resistor member 102b, 102e. Also, the hall sensor assembly 20 may detect the output voltage corresponding to the current flowing on the electric load terminal side in a non-contact manner. Accordingly, an electric potential difference of several bolts may merely be present between the output voltages of the DC shunt 102 and the hall sensor assembly 20. Therefore, unlike the related art, an insulation and step-down transformer for transferring the detected voltage signals to the control unit such as the overcurrent relay may not be required.

Hence, the microprocessor of the measuring and control unit such as the overcurrent relay connected to the DC shunt 102 and the hall sensor assembly 20 may add the output voltages output from the DC shunt 102 and the hall sensor assembly 20, respectively, (i.e., obtain the sum of vectors) so as to obtain a value which is not 0 (zero) and is proportional to a ground current. The microprocessor may thus measure the amount of ground fault current and decide the occurrence of the ground fault.

A current detecting mechanism for a DC circuit breaker according to the present disclosure may include a DC shunt 102 and a hall sensor assembly 20. An output voltage of the DC shunt 102 may be an electric potential difference across a resistor member 102b, 102e of the DC shunt 102 but not a voltage of a DC electric power system to which the DC circuit breaker is connected. Also, the hall sensor assembly 20 may be installed to be insulated from the DC electric power system, namely, an electric load side terminal in a non-contact manner. Therefore, an insulating and step-down transformer for a detected output voltage may not be required. This may result in size reduction of the DC circuit breaker and reduction of fabricating costs thereof.

As described above, in the current detecting mechanism for the DC circuit breaker according to the present disclosure, the DC shunt may include a connection conductor having a plurality of resistor members with high resistivity, a plurality of first recess portions in which the resistor members are inserted, and a load terminal part having a plurality of second recess portions in which the resistor members are inserted. The plurality of resistor members may be inserted into the recess portions of the connection member and the load terminal part, respectively, resulting in minimizing an increase of a size of the DC circuit breaker due to the current detecting mechanism.

The foregoing embodiments and advantages are merely exemplary and are not to be construed as limiting the present disclosure. The present teachings can be readily applied to other types of apparatuses. This disclosure is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing disclosure, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A direct current detecting mechanism for a direct current circuit breaker, the circuit breaker having an electric power source side terminal and an electric load side terminal, the mechanism comprising:
   a direct current detecting shunt,
   wherein the direct current detecting shunt comprises:
   a plurality of resistor members with high resistivity;
   a connection conductor having a plurality of first recess portions in which the resistor members are inserted; and
   a load terminal part having a plurality of second recess portions in which the resistor members are inserted.

2. The mechanism of claim 1, wherein the plurality of resistor members are configured by a plurality of plate-shaped resistor members with the high resistivity, and
   wherein each first recess portion of the connection conductor and each second recess portion of the load terminal part are configured by a linear recess portion.

3. The mechanism of claim 1, wherein the plurality of resistor members are configured by a plurality of rod-shaped resistor members with the high resistivity, and
   wherein each first recess portion of the connection conductor and each second recess portion of the load terminal part are configured by a circular recess portion.

4. The mechanism of claim 1, wherein the connection conductor is connected with a movable contact arm of the direct current circuit breaker.

5. The mechanism of claim 1, wherein resistance of the resistor member has a ratio of 10% to 15% of contact resistance between the connection conductor and the load terminal part when the maximum rated current flows.

6. The mechanism of claim 1, wherein the resistor members are electrically connected to the connection conductor and the load terminal part in a brazing manner after being inserted into the first recess portions of the connection conductor and the second recess portions of the load terminal part.

7. A current detecting mechanism for a direct current circuit breaker, the circuit breaker having at least a pair of electric power source side terminals and at least a pair of electric load side terminals, the mechanism comprising:
   a direct current shunt installed to be electrically connected to one of the pair of electric load side terminals and having a plurality of resistor members with high resistivity, the direct current shunt outputting an electric potential difference across the resistor members, which is proportional to a current flowing through the connected load side terminal, as a voltage signal; and
   a hall sensor assembly having a pair of magnetic cores installed near the other of the pair of electric load side terminals with being spaced therefrom for insulation, the pair of magnetic cores being installed to face each other with an air gap therebetween, and a hall sensor installed in the air gap between the magnetic cores, the hall sensor outputting an output voltage according to a magnetic flux induced in proportion to a current flowing through the other of the pair of load side terminals.

8. The mechanism of claim 7, wherein the direct current shunt comprises:
   a plurality of resistor members with high resistivity;
   a connection conductor having a plurality of first recess portions in which the resistor members are inserted; and
   an electric load terminal part having a plurality of second recess portions in which the resistor members are inserted.

9. The mechanism of claim 7, wherein the direct current shunt is installed on an anode load side terminal of the pair of load side terminals in a contact manner, and
   wherein the hall sensor is installed near a cathode load side terminal of the pair of load side terminals in a non-contact manner.

10. The mechanism of claim 8, wherein the plurality of resistor members are configured by a plurality of plate-shaped resistor pieces or a plurality of resistor rods with high resistivity.

* * * * *